(12) United States Patent
Huang et al.

(10) Patent No.: US 11,411,123 B2
(45) Date of Patent: Aug. 9, 2022

(54) SEMICONDUCTOR DEVICE AND METHOD OF FORMATION

(71) Applicant: TAIWAN SEMICONDUCTOR MANUFACTURING COMPANY LIMITED, Hsin-Chu (TW)

(72) Inventors: Chin-Yi Huang, Hsinchu (TW); Wade Shih, Nantou County (TW)

(73) Assignee: TAIWAN SEMICONDUCTOR MANUFACTURING COMPANY LIMITED

( * ) Notice: Subject to any disclaimer, the term of this patent is extended or adjusted under 35 U.S.C. 154(b) by 0 days.

(21) Appl. No.: 16/926,866

(22) Filed: Jul. 13, 2020

(65) Prior Publication Data

US 2021/0066492 A1    Mar. 4, 2021

Related U.S. Application Data

(60) Provisional application No. 62/894,054, filed on Aug. 30, 2019.

(51) Int. Cl.
| | |
|---|---|
| *H01L 29/76* | (2006.01) |
| *H01L 29/788* | (2006.01) |
| *G11C 8/14* | (2006.01) |
| *H01L 29/423* | (2006.01) |
| *H01L 27/11519* | (2017.01) |
| *H01L 21/28* | (2006.01) |
| *H01L 29/66* | (2006.01) |
| *H01L 27/11524* | (2017.01) |
| *H01L 29/40* | (2006.01) |

(52) U.S. Cl.
CPC .............. *H01L 29/788* (2013.01); *G11C 8/14* (2013.01); *H01L 27/11519* (2013.01); *H01L 27/11524* (2013.01); *H01L 29/402* (2013.01); *H01L 29/40114* (2019.08); *H01L 29/42324* (2013.01); *H01L 29/66825* (2013.01)

(58) Field of Classification Search
CPC ......... H01L 27/11519; H01L 27/11524; H01L 29/40114; H01L 29/402; H01L 29/42324; H01L 29/66825; H01L 29/788; G11C 8/14
USPC .......................................................... 257/314
See application file for complete search history.

(56) References Cited

U.S. PATENT DOCUMENTS

| | | | | |
|---|---|---|---|---|
| 2002/0105017 A1* | 8/2002 | Kim | ................. | H01L 27/11502 |
| | | | | 257/295 |
| 2005/0212020 A1* | 9/2005 | Izumi | ................ | H01L 27/11507 |
| | | | | 257/295 |
| 2016/0005749 A1* | 1/2016 | Li | ......................... | G11C 11/223 |
| | | | | 257/295 |

* cited by examiner

*Primary Examiner* — Brook Kebede
(74) *Attorney, Agent, or Firm* — Cooper Legal Group LLC.

(57) ABSTRACT

A semiconductor device includes a channel region between a source region and a drain region, a gate over the channel region, a dielectric layer over the gate, a capacitive field plate over the dielectric layer, and a word line electrically coupled to the capacitive field plate.

20 Claims, 9 Drawing Sheets

| Condition | VIA Contact 1102c | Word Line 1104 | VIA Contact 1102b |
|---|---|---|---|
| Disturb | Float | High | Low |
| Program | High | High | Low |
| Erase | High | Low | Ground |
| Read | Low | High | Ground |

SEMICONDUCTOR DEVICE AND METHOD OF FORMATION

RELATED APPLICATION

This application claims priority to U.S. Provisional Patent Application 62/894,054, titled "SEMICONDUCTOR DEVICE AND METHOD OF FORMATION" and filed on Aug. 30, 2019, which is incorporated herein by reference.

BACKGROUND

Semiconductor components are implemented in a multitude of electronic devices, such as mobile phones, laptops, desktops, tablets, watches, gaming systems, and various other industrial, commercial, and consumer electronics. Technological advances in the semiconductor art have resulted in electronic circuits having more components than those of previous generations. Moreover, the number of components per semiconductor chip area continues to increase.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

A non-volatile memory (NVM) bit cell comprises a word line capacitor stacked over a memory cell. The NVM bit cell stack comprises a channel region in a doped well of a substrate, a gate over the channel region, a dielectric layer over the gate, a capacitive field plate over the dielectric layer, and a word line over and electrically coupled to the capacitive field plate. By stacking the capacitive field plate over the gate and the dielectric layer over the capacitive field plate, the NVM bit cell has a smaller footprint compared to a conventional NVM bit cell comprising both a word line capacitive transistor and a cell transistor adjacent to the word line capacitive transistor. Thus, cell density can be increased. Also, because the word line capacitor is stacked over the memory cell and not adjacent to memory cell, the doped well region of the memory cell forms the channel region and, in contrast to the conventional NVM bit cell, the channel region does not require an implant. Because the channel region does not require an implant, NVM bit cell process design and manufacturing costs are lower than those of a NVM bit cell process that requires an implant in the channel region.

Figure 1A:
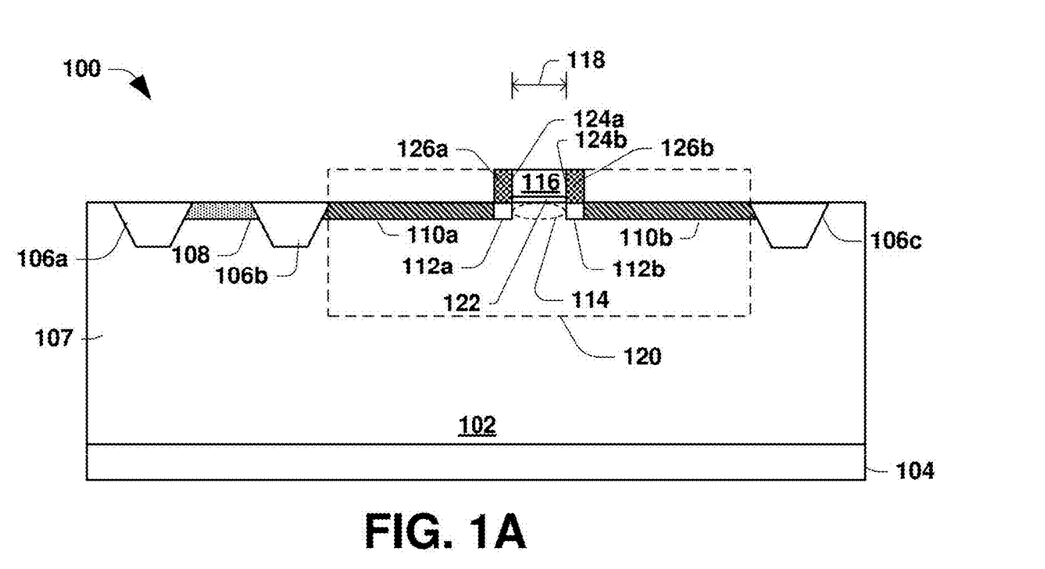
FIG. 1A is a cross-sectional view of a semiconductor device taken along line X-X in FIG. 1B, according to some embodiments.
Figure 1B:
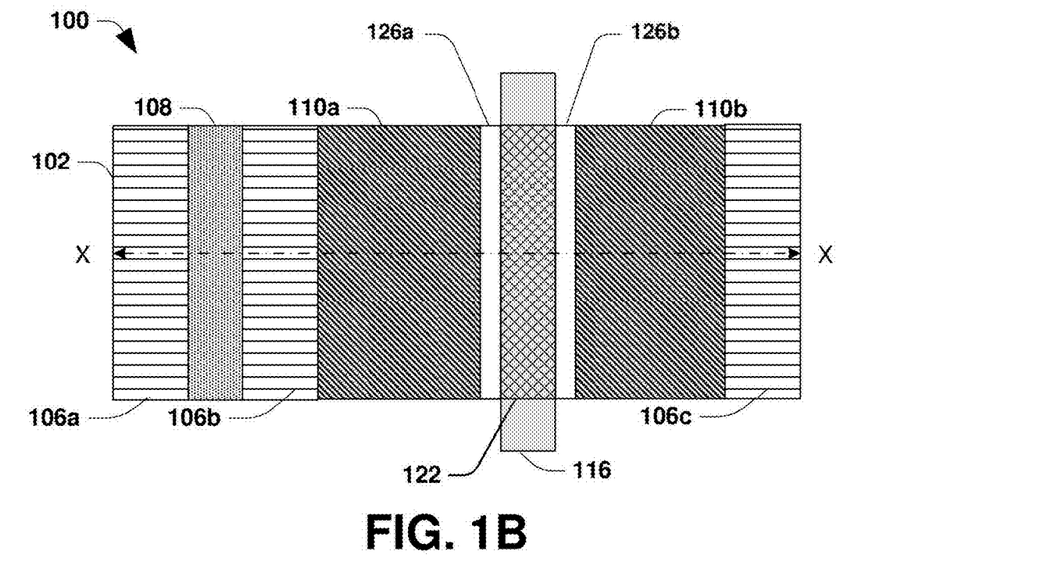
FIG. 1B is a top-down view of a semiconductor device, according to some embodiments.

Turning to FIGS. 1A and 1B, at least some of a semiconductor device 100 is formed on a substrate 102. In some embodiments, the substrate 102 comprises at least one of an epitaxial layer, a silicon-on-insulator (SOI) structure, a wafer, or a die formed from a wafer. In some embodiments, the substrate 102 comprises at least one of silicon, germanium, carbide, gallium, arsenide, arsenic, indium, oxide, sapphire, or other suitable materials. In some embodiments, the substrate 102 is at least one of a p-type substrate (P-substrate) or an n-type substrate (N-substrate). In some embodiments, the substrate 102 comprises one or more of a p-doped well region or an n-doped well region.

In some embodiments, the substrate 102 comprises a buried layer 104. In some embodiments, the buried layer 104 comprises at least one of phosphorus, arsenic, lithium, boron, aluminum, gallium, indium, or other suitable dopants. In some embodiments, the buried layer 104 is at least one of an n-type buried layer (NBL) or a p-type buried layer (PBL). In some embodiments, ion implantation or other suitable techniques are used to introduce n-type or p-type dopants into the substrate 102 to form the buried layer 104.

According to some embodiments, the semiconductor device 100 comprises one or more isolation regions, such as a first isolation region 106a, a second isolation region 106b, or a third isolation region 106c. The isolation regions 106a, 106b, 106c comprise a dielectric material and are formed in the substrate 102. According to some embodiments, one or more of the first isolation region 106a, the second isolation region 106b, or the third isolation region 106c is a shallow trench isolation (STI) region comprising at least one of oxide, nitride, or other suitable material.

According to some embodiments, the semiconductor device 100 comprises a well 107 formed in the substrate 102. The well 107 comprises dopants implanted into the substrate 102. According to some embodiments, the well 107 comprises an n-type dopant such as at least one of Phosphorus (P), Arsenic (As), Antimony (Sb), at least one Group V element, or other suitable material. According to some embodiments, the well 107 comprises a p-type dopant such as at least one of Boron (B), Aluminum (Al), Gallium (Ga), Indium (In), at least one Group III element, or other suitable material.

According to some embodiments, the semiconductor device 100 comprises a gate insulation layer 122 formed over the substrate 102. According to some embodiments, the gate insulation layer 122 is a high-k dielectric layer. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y2OxNy$, SiON, $SiN_x$, a silicate thereof, and an alloy thereof. Each value of x is independently from 0.5 to 3, and each value of y is independently from 0 to 2. According to some embodiments, the gate insulation layer 122 is an oxide formed by thermal oxidation of the silicon of a region of the substrate 102 to form an insulating layer of silicon dioxide. According to some embodiments, the gate insulation layer 122 is formed through a process of self-limiting oxidation.

According to some embodiments, the semiconductor device 100 comprises a gate electrode 116 formed over the gate insulation layer 122. According to some embodiments, the gate electrode 116 comprises a conductive material. According to some embodiments, the gate electrode 116 comprises at least one of polysilicon, metal, or other suitable material. According to some embodiments, the gate electrode 116 is formed using one or more of photolithography, etching, or other suitable processes. According to some embodiments, a gate electrode material is formed over the substrate, and a photoresist layer is formed over the gate electrode material. According to some embodiments, the photoresist layer is exposed to form a pattern, and a post-exposure developing process is performed to form a masking element. The masking element protects portions of the gate electrode material while an etching process is performed, leaving the gate electrode 116 over the substrate 102 and between an area in which a first source/drain region 110a will be formed and an area in which a second source/drain region 110b will be formed. In some embodiments, the gate electrode 116 is formed through a replacement gate process in which a dummy gate material, such as polysilicon, is used to initially form the gate electrode 116, and the dummy gate electrode material is replaced later in the process, such as after formation of the first source/drain region 110a and the second source/drain region 110b with another gate electrode material, such as metal. In such embodiments, the gate insulation layer 122 is also etched during the etching process. According to some embodiments, the gate electrode 116 has a length 118 defined by the distance between side surfaces 124a, 124b of the gate electrode 116.

According to some embodiments, the semiconductor device 100 comprises one or more memory cell (MCEL) implant regions, such as a first ion implant region 112a and a second ion implant region 112b, formed in the substrate 102 adjacent the gate insulation layer 122 and the gate electrode 116. In some embodiments, one or more of the first ion implant region 112a or the second ion implant region 112b is formed by at least one of ion implantation, molecular diffusion, or other suitable techniques. In some embodiments, one or more of the first ion implant region 112a or the second ion implant region 112b comprises at least one of p-type dopants or n-type dopants. According to some embodiments, one or more of the first ion implant region 112a or the second ion implant region 112b has a greater p-type or n-type dopant concentration than the p-type or n-type dopant concentration of the first source/drain region 110a or the second source/drain region 110b.

According to some embodiments, the semiconductor device 100 comprises one or more spacers, such as a first spacer 126a and a second spacer 126b, formed adjacent to the gate insulation layer 122 and the gate electrode 116. In some embodiments, the first spacer 126a is formed over the first ion implant region 112a and the second spacer 126b is formed over the second ion implant region 112b. One or more of the first spacer 126a or the second spacer 126b comprises at least one of an oxide, a nitride, or other suitable material. In other embodiments, spacers, such as at least one of the first spacer 126a or the second spacer 126b, are not formed adjacent to at least one of the gate insulation layer 122 or the gate electrode 116.

According to some embodiments, the semiconductor device 100 comprises one or more source/drain regions, such as a first source/drain region 110a and a second source/drain region 110b, formed in the substrate 102 between the isolation regions 106b, 106c and the gate insulation layer 122 and the gate electrode 116. In some embodiments, the first source/drain region 110a is formed between the second isolation region 106b and the first ion implant region 112a after the first spacer 126a is formed. In some embodiments, the second source/drain region 110b is formed between the third isolation region 106c and the second ion implant region 112b after the second spacer 126b is formed. One or more of the first source/drain region 110a or the second source/drain region 110b may be formed by at least one of ion implantation, molecular diffusion, or other suitable techniques. In some embodiments, one or more of the first source/drain region 110a or the second source/drain region 110b comprises at least one of p-type dopants or n-type dopants.

According to some embodiments, the semiconductor device 100 comprises one or more doped regions, such as doped region 108 formed in the substrate 102 between isolation region 106a and isolation region 106b. The doped region 108 may be formed by at least one of ion implantation, molecular diffusion, or other suitable techniques. A number or an amount of dopants implanted into the substrate 102 is controlled, such as to control a concentration of dopants in the doped region 108. According to some embodiments, an energy of dopants implanted into the substrate 102 is controlled, such as to control a depth to which dopants are implanted into the substrate 102. A depth of dopants in the substrate 102 is controlled by increasing or decreasing a voltage used to direct the dopants into the substrate 102, according to some embodiments. In some embodiments, the doped region 108 comprises at least one of p-type dopants or n-type dopants.

According to some embodiments, a number or an amount of dopants implanted into the substrate 102 to form one or more of the first source/drain region 110a or the second source/drain region 110b is controlled in the same or similar manner that the number or amount of dopants is controlled for forming doped region 108, or other suitable manner. In some embodiments, at least one of the first source/drain region 110a or the second source/drain region 110b comprises a different type of dopants than the doped region 108. For example, in some embodiments, the first source/drain region 110a and the second source/drain region 110b comprise n-type dopants when the doped region 108 comprises p-type dopants.

According to some embodiments, the semiconductor device 100 comprises a transistor 120 comprising the first source/drain region 110a, the second source/drain region 110b, the gate insulation layer 122, the gate electrode 116, and at least a portion of the substrate 102 below the gate insulation layer 122. According to some embodiments, the portion of the substrate 102 below the gate insulation layer 122 defines a channel region 114 of the transistor 120.

Figure 2:
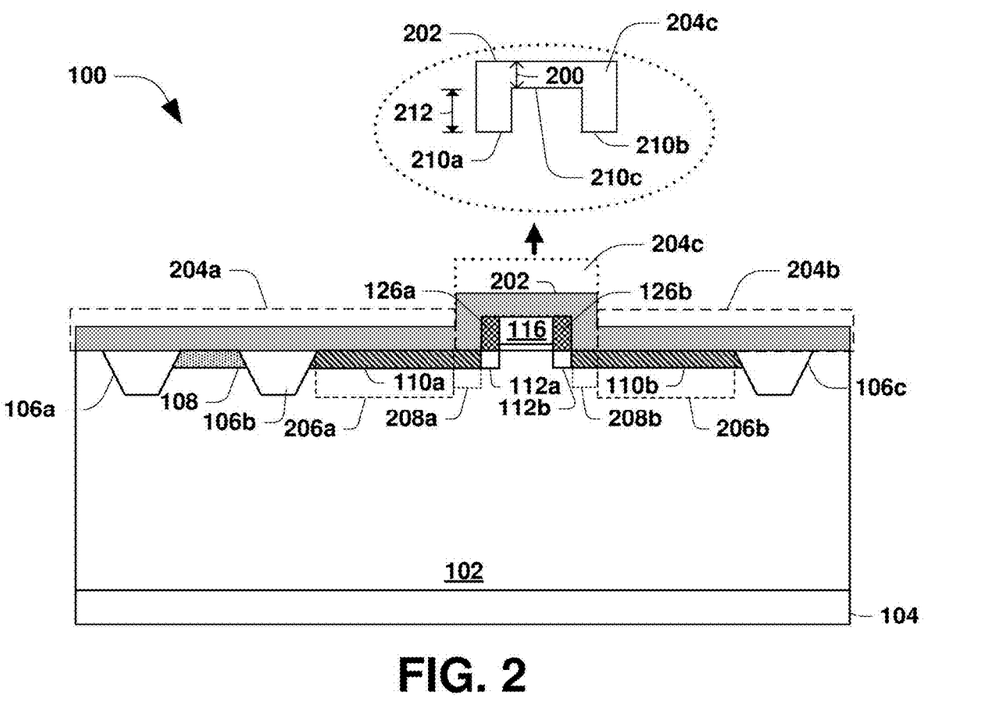
FIGS. 2-11 are cross-sectional views of a semiconductor device at various stages of fabrication taken along line X-X in FIG. 1B, according to some embodiments.

Referring to FIG. 2, a dielectric layer 202 is formed over the substrate 102, the first spacer 126a, the second spacer 126b, and the gate electrode 116, according to some embodiments. In some embodiments where at least one of the first spacer 126a or the second spacer 126b are not formed, the dielectric layer 202 is formed to directly contact at least one of a sidewall of the gate insulation layer 122 or a sidewall of the gate electrode 116. In some embodiments, the dielectric layer 202 comprises a dielectric material such as an oxide, silicon oxide, silicon nitride, silicon carbon nitride, silicon oxynitride, silicon carbide, or silicon oxycarbide, or combinations thereof, or other suitable materials. According to some embodiments, the dielectric layer 202 is a resist-protection-oxide film (RPO film). According to some embodiments, the dielectric layer 202 comprises a single oxide layer. According to some embodiments, the dielectric layer 202 comprises a plurality of layers. For example, the dielectric layer 202 may comprise a first oxide layer over the substrate 102, the first spacer 126a, the second spacer 126b, and the gate electrode 116, a silicon nitride layer over the first oxide layer, and a second oxide layer over the silicon nitride layer.

According to some embodiments, the dielectric layer 202 is formed by atomic layer deposition (ALD), chemical vapor deposition (CVD), plasma enhanced chemical vapor deposition (PECVD), or other suitable processes. In some embodiments, the dielectric layer 202 is formed to have a thickness 200 that is greater than 2 nanometers (nm). According to some embodiments, by having a thickness 200 that is greater than 2 nm, the dielectric layer 202 protects the gate electrode 116 from undergoing silicidation during a silicide formation process, such as the silicide formation process described later with respect to FIG. 7. According to some embodiments, by forming the dielectric layer 202 to have a thickness 200 that is greater than 2 nm, a photoresist layer that is resistant to silicidation is not required over the dielectric layer 202 to protect the gate electrode 116 during the silicide formation process. According to some embodiments, the dielectric layer 202 is formed to have a thickness 200 that is less than 10 nm.

According to some embodiments, the dielectric layer 202 comprises a first portion 204a, a second portion 204b, and a third portion 204c. According to some embodiments, the first portion 204a of the dielectric layer 202 overlies a first portion 206a of the first source/drain region 110a, the isolation region 106b, the doped region 108, and the isolation region 106a. According to some embodiments, the second portion 204b of the dielectric layer 202 overlies a first portion 206b of the second source/drain region 110b and the isolation region 106c. According to some embodiments, the third portion 204c of the dielectric layer 202 borders the gate electrode 116, the first spacer 126a, the second spacer 126b, the first portion 204a of the dielectric layer 202, the second portion 204b of the dielectric layer 202, a second portion 208a of the first source/drain region 110a, and a second portion 208b of the second source/drain region 110b. According to some embodiments, the second portion 208a of the first source/drain region 110a is disposed between the first portion 206a of the first source/drain region 110a and the first ion implant region 112a. According to some embodiments, the second portion 208b of the second source/drain region 110b is disposed between the first portion 206b of the second source/drain region 110b and the second ion implant region 112b. According to some embodiments, a first bottom surface 210a of the third portion 204c of the dielectric layer 202 overlies the second portion 208a of the first source/drain region 110a, and a second bottom surface 210b of the third portion 204c of the dielectric layer 202 overlies the second portion 208b of the second source/drain region 110b. According to some embodiments, a third bottom surface 210c of the third portion 204c of the dielectric layer 202 overlies the gate electrode 116, the first spacer 126a, and the second spacer 126b. According to some embodiments, the first bottom surface 210a of the third portion 204c of the dielectric layer 202 and the third bottom surface 210c of the third portion 204c of the dielectric layer 202 are separated by a distance 212 in the vertical direction.

Figure 3:
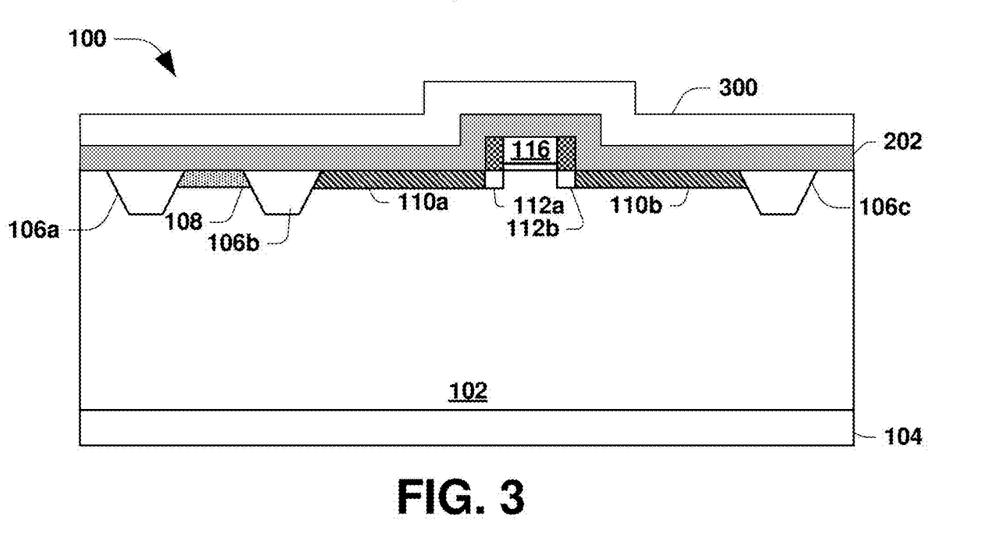

Referring to FIG. 3, a photoresist layer 300 is formed over the dielectric layer 202, according to some embodiments. The photoresist layer 300 may be formed by one or more of spinning, spray coating, or other suitable processes. The photoresist layer 300 comprises a light sensitive material such that properties, such as solubility, of the photoresist layer 300 are affected by light. The photoresist layer 300 is either a negative photoresist or a positive photoresist. With respect to a negative photoresist, regions of the negative photoresist become insoluble when illuminated by a light source such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In a positive photoresist, illuminated regions of the positive photoresist become soluble and are removed via application of a solvent during development. Thus, a pattern formed in the positive photoresist is a positive image of opaque regions of the template between the light source and the positive photoresist.

Figure 4:
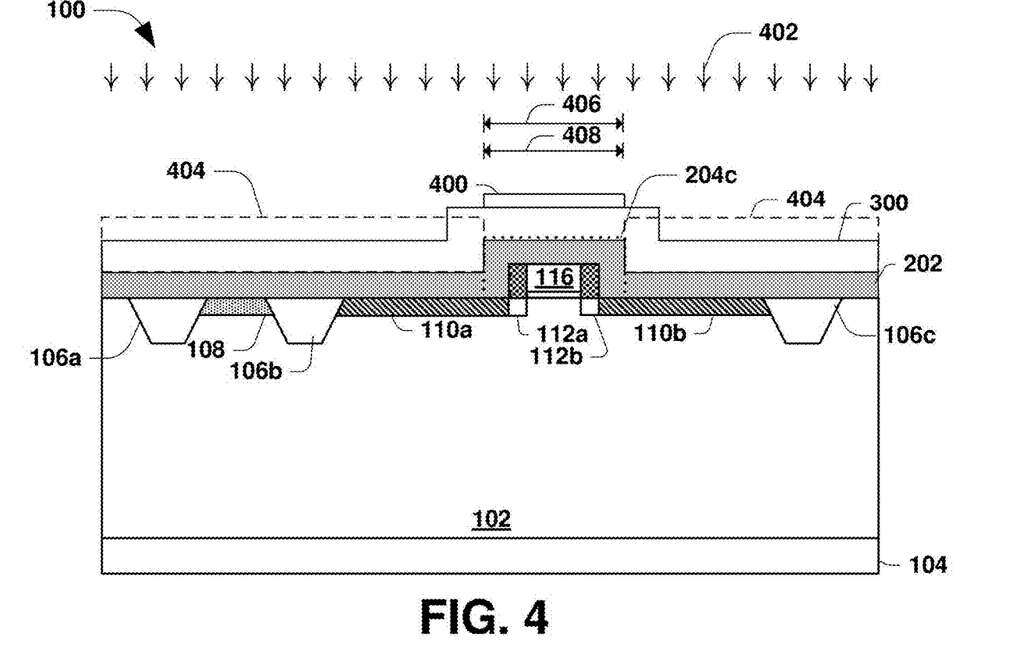

Referring to FIG. 4, when the photoresist layer 300 is a positive photoresist, a photomask 400 is formed over the portion of the photoresist layer 300 that overlies the third portion 204c of the dielectric layer 202. According to some embodiments, a width 406 of the photomask 400 is the same as, greater than, or less than a width 408 of the third portion 204c of the dielectric layer 202. According to some embodiments, exposed portions of the photoresist layer 300 (not concealed by the photomask 400) over the first portion 204a of the dielectric layer 202 and the second portion 204b of the dielectric layer 202 and the photomask 400 are illuminated by a light source 402 to polymerize the exposed portion of the photoresist layer 300, thereby forming soluble regions 404 in the photoresist layer 300.

When the photoresist layer 300 is a negative photoresist, a photomask (not shown) is formed over the first portion 204a of the dielectric layer 202 and the second portion 204b of the dielectric layer 202. According to some embodiments, an exposed portion of the photoresist layer 300 over the third portion 204c of the dielectric layer 202 and the photomask over the first portion 204a of the dielectric layer 202 and the second portion 204b of the dielectric layer 202 are illuminated by the light source 402 to polymerize the exposed portion of the photoresist layer 300.

Figure 5:
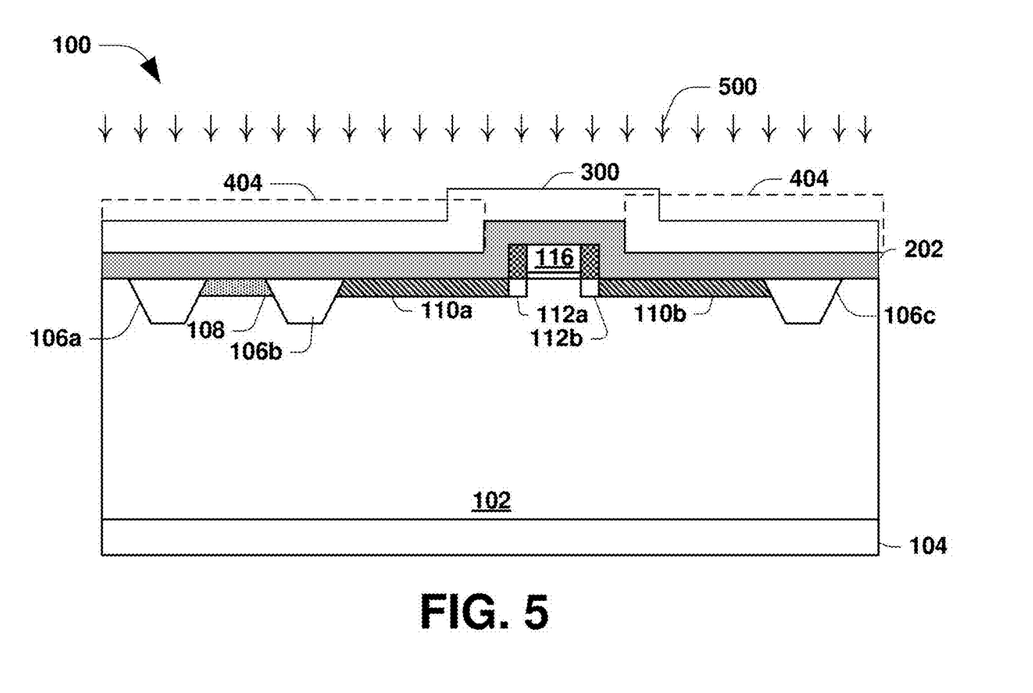

Referring to FIG. 5, regardless of whether the photoresist layer 300 is a positive photoresist or a negative photoresist, the photomask 400 is removed after the exposed portion(s) of the photoresist layer 300 and the photomask 400 have been illuminated by the light source 402, according to some embodiments. According to some embodiments, the photomask 400 is removed by one or more of chemical-mechanical polishing, wet etching, dry etching, or other suitable processes. For example, a solvent 500 is applied in some embodiments to remove the soluble regions 404 of the photoresist layer 300.

Figure 6:
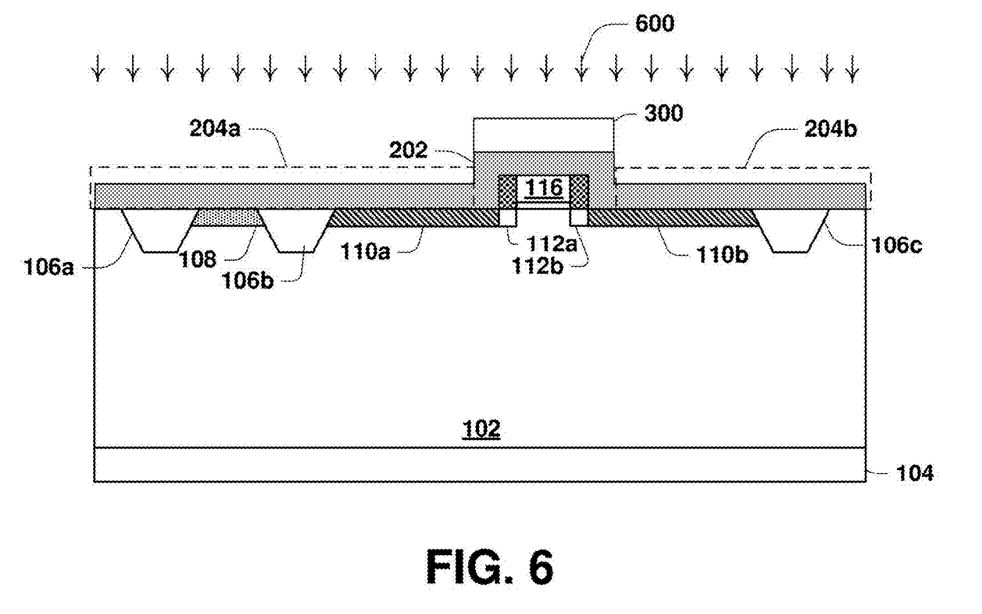

Referring to FIG. 6, according to some embodiments an etching process 600 is performed to remove portions of the dielectric layer 202 that are not protected by the photoresist layer 300. In some embodiments, the etching process 600 comprises a dry etching process. In some embodiments, the etching process 600 comprises a wet etching process, in which hydrofluoric acid or diluted hydrofluoric acid is used as the etchant. In some embodiments, the etching process 600 comprises a combination of dry etching and wet etching. According to some embodiments, the etching process 600 removes the first portion 204a of the dielectric layer 202 and the second portion 204b of the dielectric layer 202.

Figure 7:
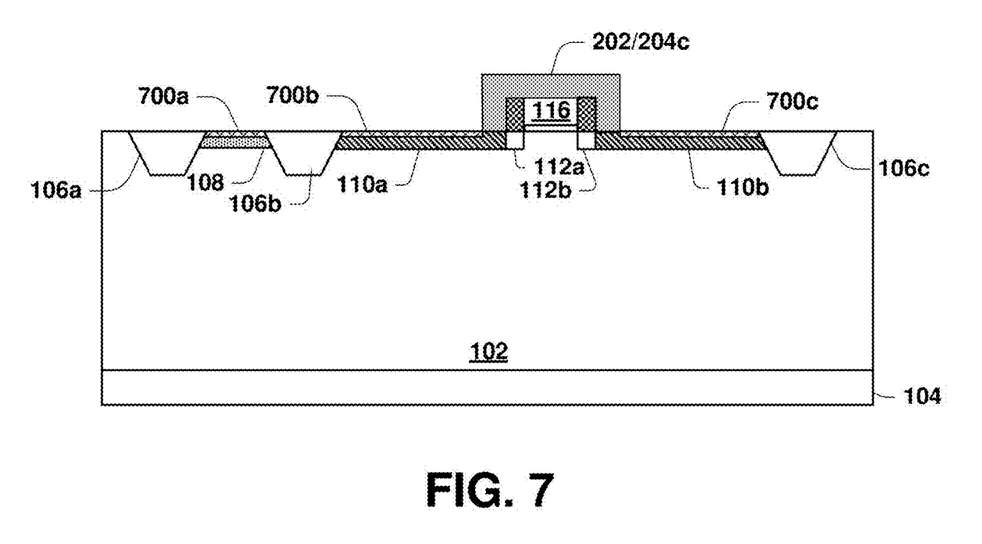

Referring to FIG. 7, according to some embodiments the photoresist layer 300 is removed. In some embodiments, the photoresist layer 300 is removed by a photoresist ashing or stripping process. According to some embodiments, removal of the photoresist layer 300 exposes unremoved portions of the dielectric layer 202, such as the third portion 204c of the dielectric layer 202.

In some embodiments, silicide regions 700a, 700b, and 700c are formed on the doped region 108, the first source/drain region 110a, and the second source/drain region 110b, respectively. In some embodiments, the silicide regions 700b and 700c are merely formed on a portion of the first source/drain region 110a and a portion of the second source/drain region 110b that is not concealed by the third portion 204c of the dielectric layer 202. For example, the silicide regions 700b and 700c may be merely formed on the first portion 206a of the first source/drain region 110a and the first portion 206b of the second source/drain region 110b.

According to some embodiments, the silicide regions 700a, 700b, and 700c are formed by a self-aligned silicide process, also referred to as a salicide process. In some embodiments, the salicide process comprises depositing a metal material via sputtering on the surface of the substrate 102 at a temperature between 500° Celsius to 900° Celsius, causing a reaction between the underlying silicon and the metal material to form the silicide regions 700a, 700b, and 700c. According to some embodiments, un-reacted metal material is etched away. In some embodiments, the silicide regions 700a, 700b, and 700c comprise one or more of titanium silicide, cobalt silicide, nickel silicide, platinum silicide, erbium silicide, palladium silicide, or other suitable material.

Figure 8:
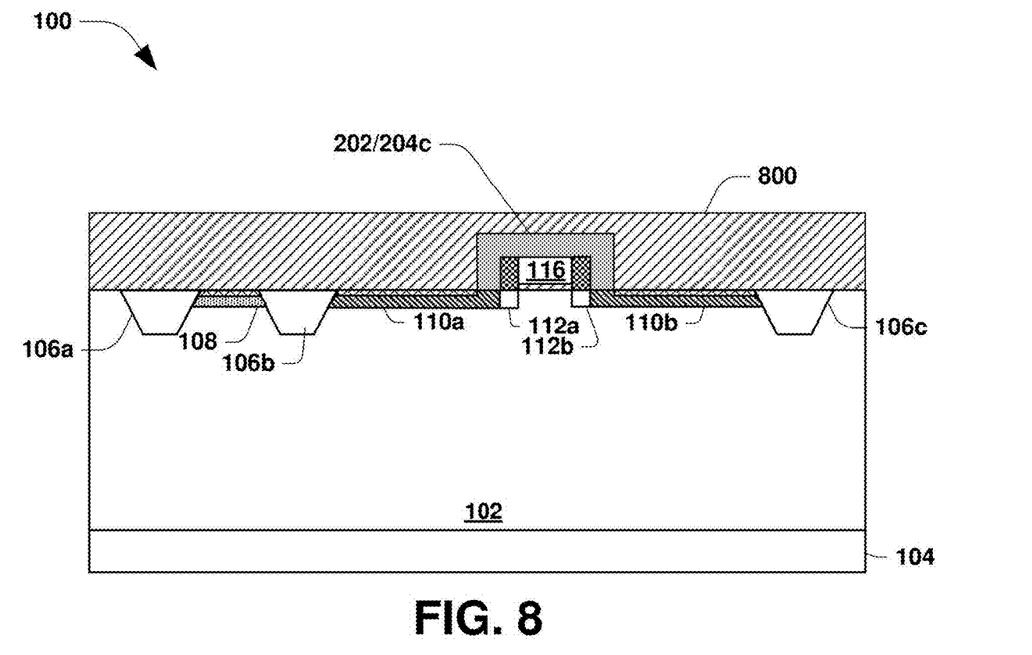

Referring to FIG. 8, an interlayer dielectric (ILD) layer 800 is formed over the substrate 102 and the dielectric layer 202, according to some embodiments. In some embodiments, the ILD layer 800 comprises a dielectric material. According to some embodiments, the dielectric material comprises one or more of silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), amorphous fluorinated carbon, bis-benzocyclobutenes (BCB), polyimide, combinations thereof, or other suitable materials. In some embodiments, the ILD layer 800 is deposited by CVD, high density plasma (HDP) CVD, sub-atmospheric CVD (SACVD), spin-on, sputtering, or other suitable processes.

Figure 9:
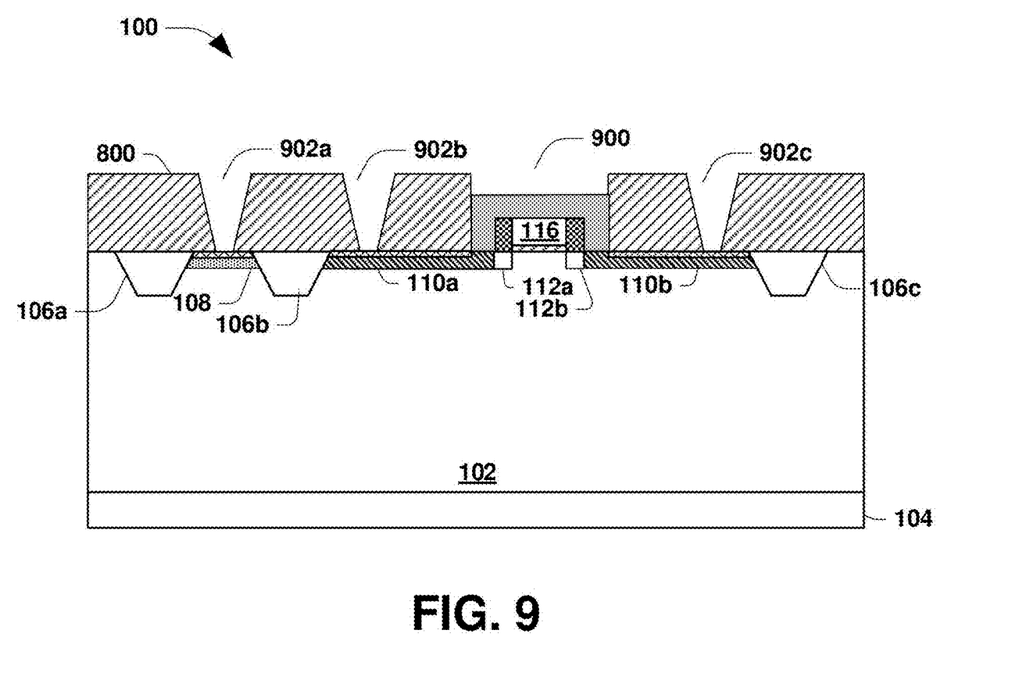

Referring to FIG. 9, the ILD layer 800 is etched via an etching process to form one or more of a gate VIA hole 900, a doped region VIA hole 902a, a first source/drain VIA hole 902b, or a second source/drain VIA hole 902c, according to some embodiments. According to some embodiments, the ILD layer 800 is etched by one or more of a photolithography process or other suitable processes.

In some embodiments, the gate VIA hole 900 is formed before formation of the doped region VIA hole 902a, the first source/drain VIA hole 902b, or the second source/drain VIA hole 902c. According to some embodiments, the gate VIA hole 900 is at least partially filled with one or more materials. In example, in some embodiments, layers of a capacitive field plate (described with respect to FIG. 10) are formed in the gate VIA hole 900 before formation of the doped region VIA hole 902a, the first source/drain VIA hole 902b, or the second source/drain VIA hole 902c. As another example, a mask layer (not shown) may be formed over and at least partially fill the gate VIA hole 900 prior to formation of the doped region VIA hole 902a, the first source/drain VIA hole 902b, or the second source/drain VIA hole 902c. The mask layer may be removed after at least one of the doped region VIA hole 902a, the first source/drain VIA hole 902b, or the second source/drain VIA hole 902c is formed and filled with a conductive material.

According to some embodiments, at least one of the doped region VIA hole 902a, the first source/drain VIA hole 902b, or the second source/drain VIA hole 902c is formed and filled with a conductive material before the gate VIA hole 900 is formed and filled. Thus, the order of process acts for forming and filling the VIA holes 902a, 902b, or 902c prior to forming and filling the gate VIA hole 900 may be the inverse to the order of the process acts discussed above for forming and filling the gate VIA hole 900 prior to forming and filling the VIA holes 902a, 902b, or 902c.

Figure 10:
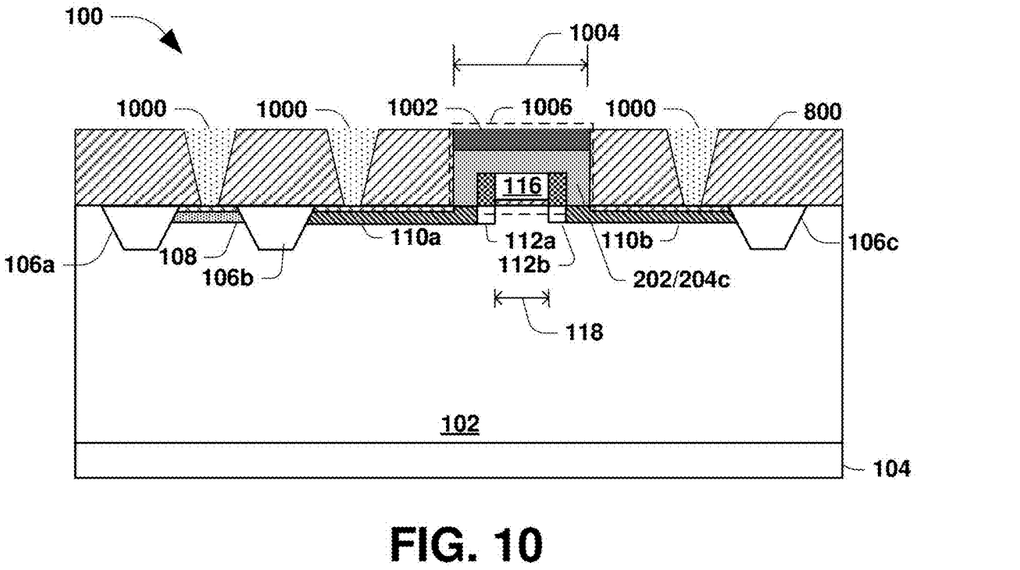

Referring to FIG. 10, the doped region VIA hole 902a, the first source/drain VIA hole 902b, and the second source/drain VIA hole 902c are filled with one or more conductive materials to form VIAs 1000, according to some embodiments. In some embodiments, one or more of the VIAs 1000 is filled with one or more of W, Ti, Co, Cu, Sn, Ni, Au, Ag, or other suitable materials. In some embodiments, one or more of the VIAs 1000 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques.

According to some embodiments, the gate VIA hole 900 is filled with one or more of W, Ti, Co, Cu, Sn, Ni, Au, Ag, or other suitable materials. According to some embodiments, a capacitive field plate (CFP) 1002 is formed in the gate VIA hole 900. According to some embodiments, the CFP 1002 comprises one or more layers of a conductive material. According to some embodiments, the CFP 1002 comprises one or more conductive layers and one or more dielectric films. According to some embodiments, the CFP 1002 comprises one or more oxide film layers. According to some embodiments, the CFP 1002 comprises one or more conductive plates. According to some embodiments, the CFP 1002 comprises one or more oxide plates. According to some embodiments, the CFP 1002 comprises an oxide film material in between two conductive plates. According to some embodiments, the CFP 1002 comprises a conductive plate comprising one or more of W, Ti, Co, Cu, Cu, Sn, Ni, Au, Ag, or other suitable materials. According to some embodiments, the CFP 1002 comprises a dielectric plate or film comprising one or more of a ceramic material, a synthetic or semi-synthetic organic compound, an oxide, or other suitable materials. According to some embodiments, the CFP 1002 comprises a dielectric plate or film comprising a same or similar material as the dielectric layer 202 or RPO film. According to some embodiments, the CFP 1002 and the dielectric layer 202 both comprises an oxide film. According to some embodiments, the semiconductor device 100 comprises a capacitor 1006 comprising the CFP 1002 as a first (upper) conductor, the dielectric layer 202 as a dielectric, and the gate electrode 116 as a second (lower) conductor.

According to some embodiments, the CFP 1002 has a length 1004. According to some embodiments, the length 1004 of the CFP 1002 is one of greater than, equal to, or less than the length 118 of the gate electrode 116. According to some embodiments, at least a portion of the CFP 1002 is over the gate electrode 116. According to some embodiments, at least a portion of the CFP 1002 is directly over or overlies the gate electrode 116.

According to some embodiments, if the length 1004 of the CFP 1002 is greater than the length 118 of the gate electrode 116, a coupling ratio between the CFP 1002 and the gate electrode 116 is greater relative to a configuration in which the length 1004 of the CFP 1002 is not greater than the length 118 of the gate electrode 116. According to some embodiments, the greater the coupling ratio between the CFP 1002 and the gate electrode 116, the greater the performance of the semiconductor device 100 at lower operating voltages. According to some embodiments, an operating voltage of the semiconductor device 100 is a voltage applied to the CFP 1002 to charge the gate electrode 116. According to some embodiments, if the length 1004 of the CFP 1002 is greater than the length 118 of the gate electrode 116, a lower voltage applied to the CFP 1002 will sufficiently charge the gate electrode 116, relative to the voltage required to charge the gate electrode 116 if the length 1004 of the CFP 1002 is not greater than the length 118 of the gate electrode 116. According to some embodiments, the length 118 of the gate electrode 116 is less than, equal to, or greater than 0.18 microns (μm), and the length 1004 of the CFP 1002 is equal to or greater than 0.3 μm.

According to some embodiments, at least 0.12 μm of the CFP 1002 in the length direction is over the gate electrode 116. According to some embodiments, at least 0.12 μm of the CFP 1002 in the length direction is directly over or overlies the gate electrode 116. According to some embodiments, the CFP 1002 is over at least 0.12 μm of the gate electrode 116 in the length direction. According to some embodiments, the CFP 1002 is directly over or overlies at least 0.12 μm of the gate electrode 116 in the length direction. According to some embodiments, overlapping the CFP 1002 and the gate electrode 116 by at least 0.12 μm in the length direction provides a coupling ratio of a magnitude sufficiently high to permit the use of lower operating voltages, relative to operating voltages required if the CFP 1002 and the gate electrode overlap by less than 0.12 μm.

Figure 11:
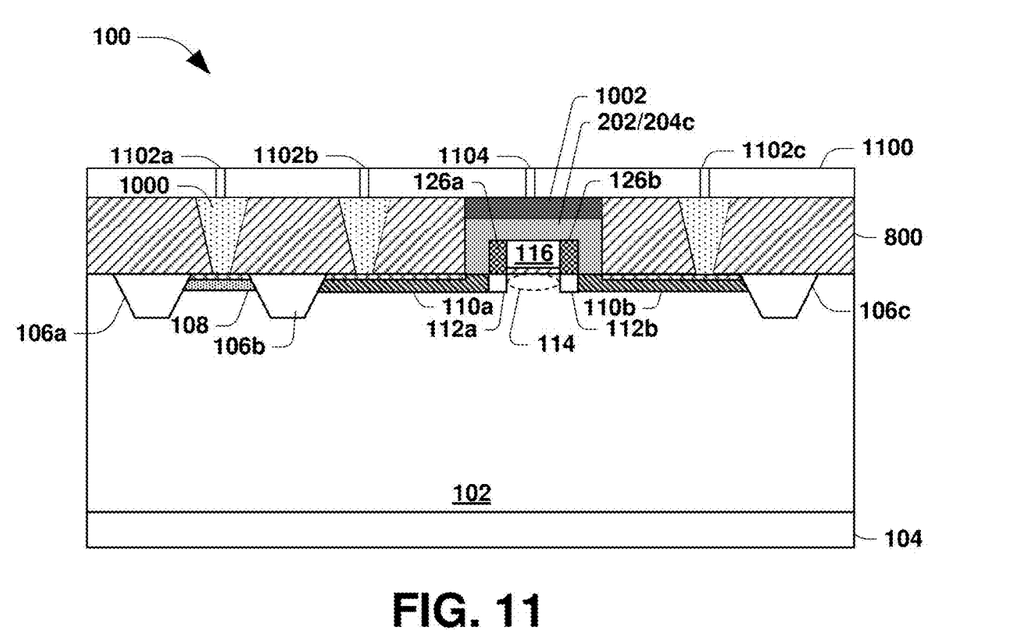

Referring to FIG. 11, the semiconductor device 100 comprises a contact layer 1100 formed over the ILD layer 800 after the VIAs 1000 and the CFP 1002 are formed, according to some embodiments. In some embodiments, the contact layer 1100 comprises a dielectric material such as one or more of silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), amorphous fluorinated carbon, bis-benzocyclobutenes (BCB), polyimide, combinations thereof, or other suitable materials. In some embodiments, the contact layer 1100 is deposited by CVD, high density plasma (HDP) CVD, sub-atmospheric CVD (SACVD), spin-on, sputtering, or other suitable processes.

According to some embodiments, the contact layer 1100 comprises VIA contacts 1102a, 1102b, and 1102c. According to some embodiments, the VIA contact 1102a is electrically coupled to the doped region 108, the VIA contact 1102b is electrically coupled to the first source/drain region 110a, or the VIA contact 1102c is electrically coupled to the second source/drain region 110b. According to some embodiments, the contact layer 1100 comprises a word line 1104 electrically coupled to the CFP 1002.

Figure 12:
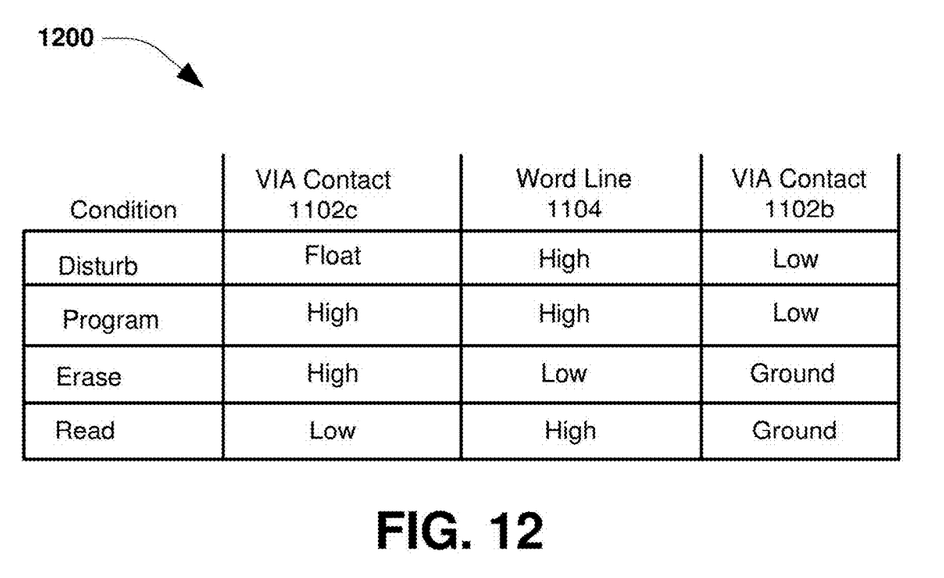
FIG. 12 illustrates various contact signals for performing memory functions of a semiconductor device, according to some embodiments.

According to some embodiments, the semiconductor device 100 of FIG. 11 functions as a memory cell. FIG. 12 is a table 1200 showing the relative magnitudes of various contact signals for performing memory functions of the semiconductor device 100 of FIG. 11, according to some embodiments. In some embodiments, VIA contact 1102c is a drain contact electrically coupled to the second source/drain region 110b, word line 1104 is a gate contact electrically coupled to the gate electrode 116, and VIA contact 1102b is a source contact electrically coupled to the first source/drain region 110a. According to some embodiments, memory cell conditions of the semiconductor device 100 include disturb, program, erase, and read. According to some embodiments, each contact is set to a signal level per the table 1200 to place the semiconductor device 100 in one or more of the memory cell conditions as shown.

Figure 13:
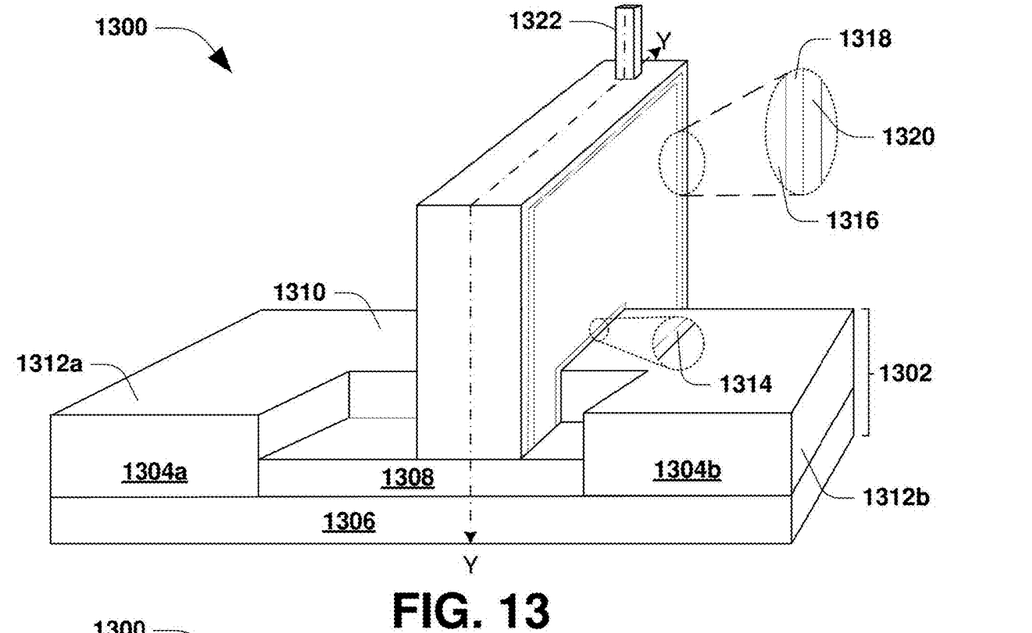
FIG. 13 illustrates a semiconductor device, according to some embodiments.
Figure 14:
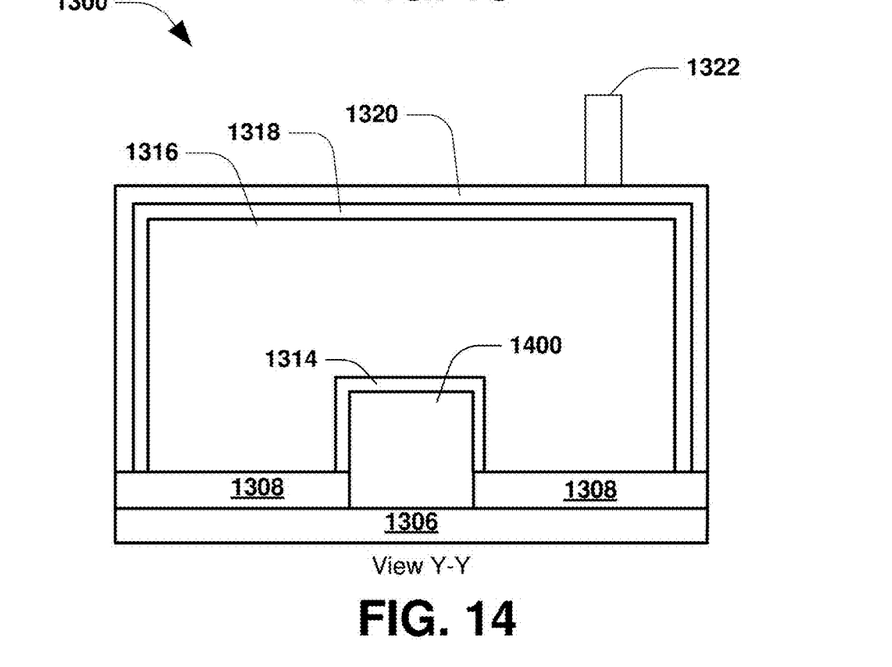
FIG. 14 is a cross-sectional view of a semiconductor device taken along line Y-Y in FIG. 13, according to some embodiments.

Referring to FIGS. 13 and 14, a semiconductor device 1300 comprises a substrate 1302 comprising a first fin structure 1304a and a second fin structure 1304b overlying a buried oxide layer 1306. According to some embodiments, the semiconductor device 1300 comprises one or more isolation regions, such as isolation region 1308. The isolation region 1308 comprises a dielectric material and is disposed in the substrate 1302. According to some embodiments, the isolation region 1308 is a shallow trench isolation (STI) region comprising at least one of oxide, nitride, or other suitable material.

According to some embodiments, the semiconductor device 1300 comprises a well 1310 comprising dopants implanted into the substrate 1302. According to some embodiments, the well 1310 comprises an n-type dopant such as at least one of Phosphorus (P), Arsenic (As), Antimony (Sb), at least one Group V element, or other suitable material. According to some embodiments, the well 1310 comprises a p-type dopant such as at least one of Boron (B), Aluminum (Al), Gallium (Ga), Indium (In), at least one Group III element, or other suitable material. According to some embodiments, the well 1310 abuts the isolation region 1308.

In some embodiments, a channel region 1400 is between the first fin structure 1304a and the second fin structure 1304b and a gate insulation region 1314 is over the channel region 1400. The semiconductor device 1300 comprises a gate 1316 over the gate insulation region 1314 and a dielectric layer 1318 over the gate 1316. According to some embodiments, the semiconductor device 1300 comprises a capacitive field plate 1320 over the dielectric layer 1318 and a word line 1322 electrically coupled to the capacitive field plate 1320. According to some embodiments, the first fin structure 1304*a* comprises a first source/drain region 1312*a* and the second fin structure 1304*b* comprises a second source/drain region 1312*b*. In some embodiments, one or more of the first source/drain region 1312*a* or the second source/drain region 1312*b* is formed by at least one of ion implantation, molecular diffusion, or other suitable techniques.

While FIGS. 2-8 illustrate a process in which the dielectric layer 202 and the ILD layer 800 are separately formed. In some embodiments, the dielectric layer 202 may serve the function of the ILD layer. For example, with respect to FIG. 15, in some embodiments, after the semiconductor device 100 illustrated in FIG. 1A is formed, the dielectric layer 202 may be formed to a thickness 1500 greater than the thickness 200 of the dielectric layer 202 of FIG. 2.

Figure 15:
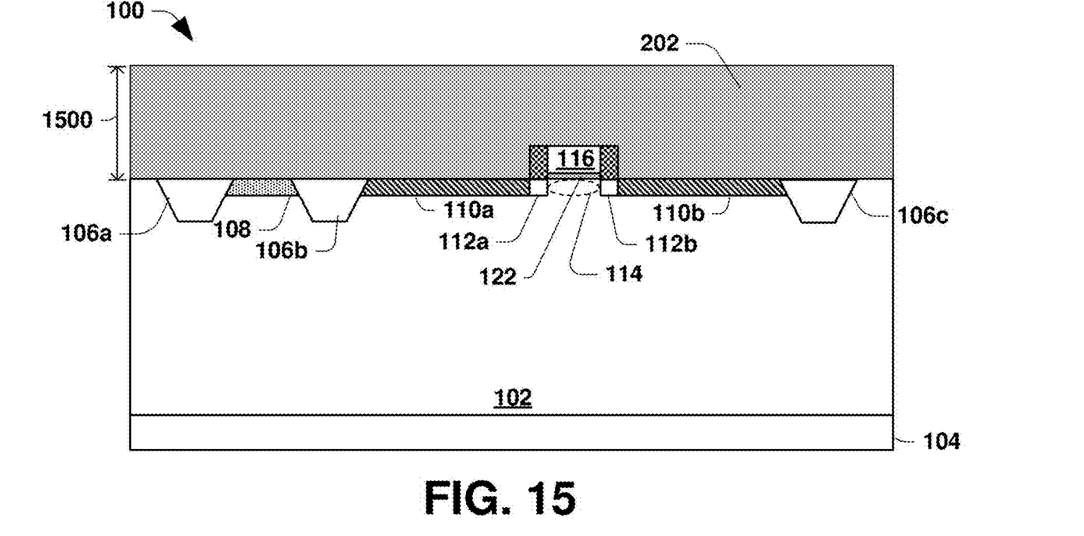
FIGS. 15-16 are cross-sectional views of a semiconductor device at various stages of fabrication taken along line X-X in FIG. 1B, according to some embodiments.

The dielectric layer 202 of FIG. 15 may be formed by way of one or more of the deposition methods described above with respect to the formation of the dielectric layer 202 or the ILD layer 800, or other suitable processes. In some embodiments, the dielectric layer 202 may serve the function of the ILD layer, the formation of features illustrated in FIGS. 3-8 may be omitted from the formation of the semiconductor device 100.

Figure 16:
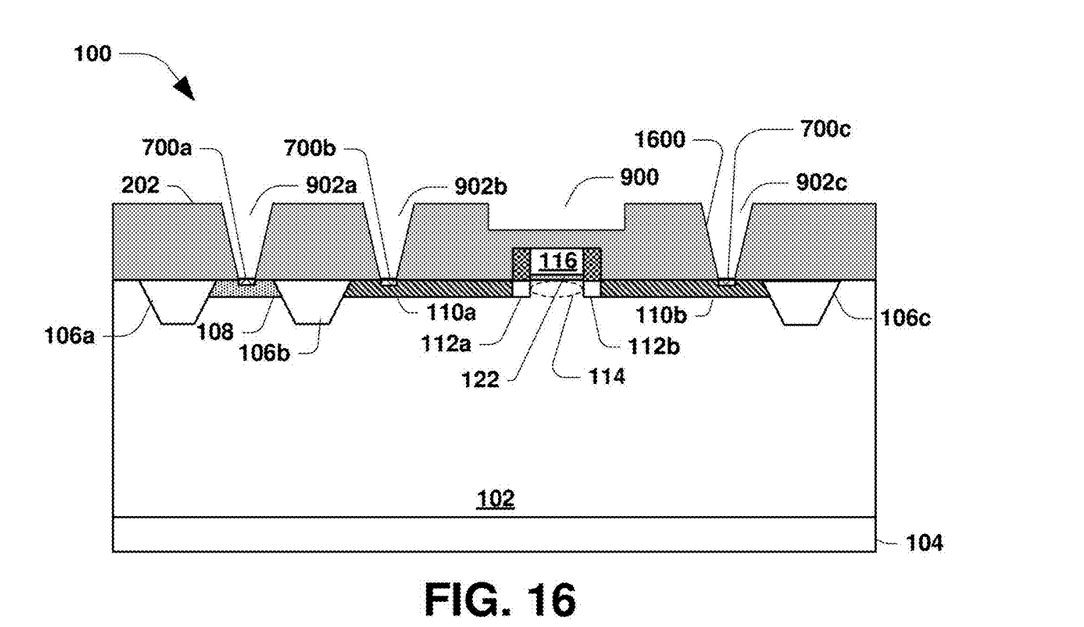

Referring to FIG. 16, the dielectric layer 202 is etched via an etching process to form one or more of the gate VIA hole 900, the doped region VIA hole 902*a*, the first source/drain VIA hole 902*b*, or the second source/drain VIA hole 902*c* as described with respect to FIG. 9.

In some embodiments, silicide regions 700*a*, 700*b*, and 700*c* are formed on the doped region 108, the first source/drain region 110*a*, and the second source/drain region 110*b*, respectively. According to some embodiments, the silicide regions 700*a*, 700*b*, and 700*c* are formed by depositing a metal material on the doped region 108, the first source/drain region 110*a*, and the second source/drain region 110*b*. Formation of the silicide regions 700*a*, 700*b*, and 700*c* may comprise etching away silicide formation material from side surfaces 1600 that define one or more of the doped region VIA hole 902*a*, the first source/drain VIA hole 902*b*, or the second source/drain VIA hole 902*c*. According to some embodiments, a material of the dielectric layer 202 comprises an etch-stop layer. For example, the dielectric layer 202 may comprise an RPO film that may function as an etch-stop layer while etching away silicide formation material from the side surfaces 1600. Thereafter, the process may resume as described with respect to FIGS. 10 and 11.

According to some embodiments, a word line signal is transmitted through the CFP 1002 to the dielectric layer 202 and from the dielectric layer 202 to a floating gate electrode, such as gate electrode 116 of an NVM bit cell. The dielectric layer 202 under the CFP 1002 establishes a capacitive coupling of the word line signal to the floating gate electrode. Disturb, program, erase, and read conditions of the NVM bit cell are established through the application of predetermined signal levels to the drain, source, and word line contacts of the NVM bit cell.

According to some embodiments, a semiconductor device includes a transistor comprising a first source/drain region and a second source/drain region, a channel region between the first source/drain region and the second source/drain region, a gate electrode over the channel region, a dielectric layer over the gate electrode, a capacitive field plate over the dielectric layer, and a word line electrically coupled to the capacitive field plate.

According to some embodiments, a method of forming a semiconductor device includes forming a first dielectric layer over a gate electrode and a first source/drain region of a transistor, removing a first portion of the first dielectric layer over the first source/drain region to expose a first portion of the first source/drain region, forming a capacitive field plate over the first dielectric layer after removing the first portion of the first dielectric layer, and coupling a word line to the capacitive field plate.

According to some embodiments, a semiconductor device includes a transistor comprising a first source/drain region coupled to a source line, a second source/drain region, a channel region between the first source/drain region and the second source/drain region, and a gate electrode over the channel region. According to some embodiments, the semiconductor device comprises a capacitive field plate overlying the gate electrode and a word line coupled to and overlying the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
   a transistor, comprising:
      a first source/drain region;
      a second source/drain region;
      a channel region between the first source/drain region and the second source/drain region; and
      a gate electrode over the channel region;
   a dielectric layer over the gate electrode;
   a capacitive field plate over the dielectric layer; and
   a word line electrically coupled to the capacitive field plate.

2. The semiconductor device of claim 1, comprising:
   a first ion implant region disposed between the first source/drain region and the channel region; and
   a second ion implant region disposed between the second source/drain region and the channel region.

3. The semiconductor device of claim 1, comprising:
   a spacer disposed between the gate electrode and the dielectric layer.

4. The semiconductor device of claim 1, comprising:
   an isolation region adjacent to the first source/drain region; and
   a doped region adjacent to the isolation region.

5. The semiconductor device of claim 4, comprising:
   a vertical interconnect access (VIA) electrically coupled to the doped region; and
   a body contact electrically coupled to the VIA.

6. The semiconductor device of claim 1, wherein:
   the gate electrode has a first length, and
   the capacitive field plate has a second length different than the first length.

7. The semiconductor device of claim 6, wherein the second length is greater than the first length.

8. The semiconductor device of claim 1, wherein the capacitive field plate overlies the gate electrode.

9. The semiconductor device of claim 1, wherein the dielectric layer comprises a resist protective oxide (RPO) film.

10. The semiconductor device of claim 9, wherein the RPO film comprises an oxide-silicon nitride-oxide stack.

11. The semiconductor device of claim 1, wherein the gate electrode, the dielectric layer, and the capacitive field plate constitute a capacitor.

12. The semiconductor device of claim 1, wherein the first source/drain region and the second source/drain region comprise fin structures.

13. A method of forming a semiconductor device, comprising:
    forming a first dielectric layer over a gate electrode and a first source/drain region of a transistor;
    removing a first portion of the first dielectric layer over the first source/drain region to expose a first portion of the first source/drain region;
    forming a capacitive field plate over the first dielectric layer after removing the first portion of the first dielectric layer; and
    coupling a word line to the capacitive field plate.

14. The method of claim 13, wherein removing the first portion of the first dielectric layer over the first source/drain region of the transistor comprises:
    forming a photoresist layer over the gate electrode and the first source/drain region of the transistor; and
    etching the first dielectric layer while the photoresist layer is over the gate electrode and a second portion of the first source/drain region to remove the first portion of the first dielectric layer.

15. The method of claim 13, wherein forming the capacitive field plate comprises:
    forming the capacitive field plate to overlie the gate electrode and a second portion of the first source/drain region.

16. The method of claim 13, comprising:
    forming a second dielectric layer over the first source/drain region after removing the first portion of the first dielectric layer; and
    etching the second dielectric layer after removing the first portion of the first dielectric layer.

17. The method of claim 13, wherein the first dielectric layer comprises a resist protective oxide (RPO) film.

18. A semiconductor device, comprising:
    a transistor comprising:
       a first source/drain region coupled to a source line;
       a second source/drain region;
       a channel region between the first source/drain region and the second source/drain region; and
       a gate electrode over the channel region;
    a capacitive field plate overlying the gate electrode;
    a dielectric layer between the gate electrode and the capacitive field plate; and
    a word line overlying the gate electrode, wherein the word line is electrically coupled to the gate electrode through the capacitive field plate and the dielectric layer.

19. The semiconductor device of claim 18, wherein:
    the capacitive field plate overlies the first source/drain region, and
    the capacitive field plate is spaced apart from the first source/drain region by the dielectric layer.

20. The semiconductor device of claim 18, wherein the gate electrode is between a first portion of the dielectric layer and a second portion of the dielectric layer.

* * * * *